(12) United States Patent
Yang et al.

(10) Patent No.: US 7,462,915 B2
(45) Date of Patent: Dec. 9, 2008

(54) METHOD AND APPARATUS FOR INCREASE STRAIN EFFECT IN A TRANSISTOR CHANNEL

(75) Inventors: Haining S. Yang, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 11/467,446

(22) Filed: Aug. 25, 2006

(65) Prior Publication Data

US 2006/0286786 A1 Dec. 21, 2006

Related U.S. Application Data

(62) Division of application No. 10/707,842, filed on Jan. 16, 2004, now Pat. No. 7,118,999.

(51) Int. Cl.
*H01L 29/94* (2006.01)

(52) U.S. Cl. ............... 257/369; 257/411; 257/E29.156; 257/E29.16

(58) Field of Classification Search ........... 257/411, 257/366, 635, 288, E29.156, E29.16, E29.161
See application file for complete search history.

(56) References Cited

U.S. PATENT DOCUMENTS

| 3,602,841 A | 8/1971 | McGroddy |
| 4,665,415 A | 5/1987 | Esaki et al. |
| 4,853,076 A | 8/1989 | Tsaur et al. |
| 4,855,245 A | 8/1989 | Neppl et al. |
| 4,952,524 A | 8/1990 | Lee et al. |

(Continued)

FOREIGN PATENT DOCUMENTS

JP  64-76755  3/1989

OTHER PUBLICATIONS

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

(Continued)

*Primary Examiner*—Walter L Lindsay, Jr.
(74) *Attorney, Agent, or Firm*—Joseph P. Abate; Greenblum & Bernstein, P.L.C.

(57) ABSTRACT

A semiconductor device having a transistor channel with an enhanced stress is provided. To achieve the enhanced stress transistor channel, a nitride film is preferentially formed on the device substrate with little to no nitride on a portion of the gate stack. The nitride film may be preferentially deposited only on the silicon substrate in a non-conformal layer, where little to no nitride is deposited on the upper portions of the gate stack. The nitride film may also be uniformly deposited on the silicon substrate and gate stack in a conformal layer, with the nitride film proximate the upper regions of the gate stack preferentially removed in a later step. In some embodiments, nitride near the top of the gate stack is removed by removing the upper portion of the gate stack. In any of the methods, stress in the transistor channel is enhanced by minimizing nitride deposited on the gate stack, while having nitride deposited on the substrate.

15 Claims, 7 Drawing Sheets

U.S. PATENT DOCUMENTS

| | | | |
|---|---|---|---|
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Bransen et al. | |
| 5,880,040 A | 3/1999 | Sun et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,153,501 A | 11/2000 | Becker | |
| 6,165,383 A | 12/2000 | Chou | |
| 6,198,144 B1 | 3/2001 | Pan et al. | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,277,720 B1* | 8/2001 | Doshi et al. | 438/586 |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | Von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdini et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,717,216 B1 | 4/2004 | Doris et al. | |
| 6,825,529 B2 | 11/2004 | Chidambarrao et al. | |
| 6,831,292 B2 | 12/2004 | Currie et al. | |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2002/0115288 A1* | 8/2002 | Wu | 438/664 |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0238914 A1 | 12/2004 | Deshpande et al. | |
| 2004/0262784 A1 | 12/2004 | Doris et al. | |
| 2005/0040460 A1 | 2/2005 | Chidambarrao et al. | |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106799 A1 | 5/2005 | Doris et al. | |
| 2005/0136583 A1* | 6/2005 | Chen et al. | 438/199 |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |
| 2006/0281272 A1* | 12/2006 | Yang et al. | 438/303 |
| 2007/0158752 A1* | 7/2007 | Anderson et al. | 257/369 |
| 2008/0122003 A1* | 5/2008 | Fang et al. | 257/369 |

OTHER PUBLICATIONS

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps".2004 IEEE, 4 pages.

J.C. Bean, et al., "GEx SI 1-x/Si Strained-Layer Superlattice Grown by Molecular Beam Epitaxy", J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

Kem Rim, et al., "Transconductance Enhancement in Deep Submicron Strained-Si $n$-MOSFETS," International Electron Devices Meeting, 26, 8, 1, IEEE, Sep. 1998.

Kem Rim, et al., "Characteristics and Device Design of Sub-100 nm Straing Si N- and PMOSFETS," 2002 Symposium On VLSI Technology Digest of Technical Papers, IEEE, pp. 98-99.

Gregory Scott, et al., "NMOS drive Current Reduction Caused by Transistor Layout and Trench Isolation Induced Stress," International Electron Devices Meeting, 33.4.1, IEEE, Sep. 1999.

F. Ootsuka, et a., "A Highly Dense, High-Performance 130nm node CMOS Technology for Large Scale System-on-a-Chip Application," International Electron Devices Meeting, 23.5.1, IEEE, Apr. 2000.

Shinya Ito, et al., "Mechanical Stress Effect of Etch-Stop Nitride and its Impact on Deep Submicron Transistor Design," International Electron Devices Meeting, 23.5.1, IEEE, Apr. 2000.

A. Shimizu, et al., "Mechanical-Stress Effect of Etch-Stop Nitride and its Impact on Deep Submicron Transistor Design," International Electron Devices Meeting, IEEE, Mar. 2001.

K. Ota, et al., "Novel Locally Strained Channel Technique for High Performance 55nm CMOS," International Electron Devices Meeting, 2.2.1, IEEE, Feb. 2002.

* cited by examiner

METHOD AND APPARATUS FOR INCREASE STRAIN EFFECT IN A TRANSISTOR CHANNEL

CROSS REFERENCE TO RELATED APPLICATIONS

This application is a divisional application of U.S. patent application Ser. No. 10/707,842 filed on Jan. 16, 2004, the contents which are incorporated by reference in its entirety.

BACKGROUND OF THE INVENTION

Field of the Invention

The invention generally relates to the enhancement of transistor performance, and more particularly to the enhancement of transistor performance by creating a desired stress in the transistor channel region.

As semiconductor devices shrink, carrier mobility has become a roadblock for improved device speed. Studies have shown that electron mobility can be increased significantly by creating tensile stress in a transistor channel, and hole mobility can be improved by creating compressive stress. Thus, to improve the characteristics of a semiconductor device, tensile and/or compressive stresses are created in the channel of the n-type devices (e.g., nFETs) and/or p-type devices (e.g., pFETs). Additionally, the higher the stress in the channel, the higher mobility improvement which may be realized.

The channel stress may be induced by a $Si_3N_4$ or nitride film deposited on top of the transistor. The induced stress in the channel has the same sign (tensile or compressive) with that of the nitride film. However, the induced channel stress is only a fraction of the nitride film in the magnitude. Typical stresses are about 12 GPa for tensile stresses, and about 12.5 GPa for compressive stresses, hence, the maximum strain effect is limited.

For example, a related art transistor having a stressed transistor channel includes a silicon substrate having a gate oxide formed on its upper surface. Next, a polysilicon gate is deposited on the gate oxide. Offset spacers or gate sidewalls are formed adjacent both sides of the polysilicon gate. The gate sidewalls may be used to form a proper ion implanted extension structure within the silicon substrate. Additionally, $Si_3N_4$ spacers are formed fully on each sidewall of the polysilicon gate. It should be noted that the $Si_3N_4$ spacers are typically attached to the gate sidewalls prior to ion implantation. Next, ion implantation is used to form source/drain regions within the silicon substrate on both sides of the polysilicon gate.

Further processing includes forming substrate salicide regions proximate to the source/drain regions and a gate salicide region formed on the polysilicon gate. The substrate and gate salicide regions may include CoSi or NiSi. The substrate and gate salicide regions are formed self-aligned to the source/drain regions and polysilicon gate regions.

Next, a highly stressed $Si_3N_4$ or nitride film is uniformly deposited over the silicon substrate, source and drain regions, offset spacers, and polysilicon gate with a same thickness. The stressed nitride film is deposited as a conformal layer, including being deposited over the sidewall spacers. The nitride film causes stress in the silicon substrate, including the transistor channel region through a mismatch in the crystal lattice structures of the silicon substrate and the nitride film. The induced stress in the transistor channel region is proportional and of the same sign (tensile or compressive) with the stress in the nitride film. The magnitude of the induced stress is a fraction of the stress in the nitride film.

It should be noted that in the device described above, the induced stress in the transistor channel region is a small fraction of the stress of the nitride film. Because the improvement in carrier mobility increases with increased stress magnitude in the transistor channel region, a method to produce higher stress in the transistor channel region would further improve transistor performance.

SUMMARY OF INVENTION

The invention includes a method of enhancing stress in a semiconductor device having a gate stack disposed on a substrate, including depositing a nitride film along a surface of the substrate and the gate stack, wherein the nitride film is thicker over a surface of the substrate and thinner over a portion of the gate stack.

The invention also includes a method of enhancing stress in a semiconductor device having a gate stack disposed on a substrate, including depositing a layer of nitride film over the gate stack and a surface of the substrate, and removing a portion of the gate stack and the nitride film deposited thereon.

The invention also includes a semiconductor device, having a silicon substrate, a gate stack disposed on the silicon substrate, a stressed nitride film disposed on the silicon substrate and the gate stack, wherein the stressed nitride film is thicker over the silicon substrate and thinner over a portion Of the gate stack.

DETAILED DESCRIPTION

Transistor performance may be enhanced by creating stress in the transistor channel region. Accordingly, a gate structure may be made so that an enhanced stress is induced in the transistor channel from a stressed nitride film. To achieve this enhanced strain effect, one embodiment of the invention includes removing the gate spacer from the wafer after salicide is formed and then depositing a non-conformal $Si_3N_4$ film including forming little or no nitride on gate sidewalls at the top of the gate stack. In this manner, enhancement of transistor performance is provided by creating a desired stress in the transistor channel region of the device. It should be noted that this method and apparatus to increase strain effect in a channel of a transistor works for both n-type or p-type devices. As such, the nitride may be made either tensile or compressive by suitably adjusting the deposition parameters as is well known in the art.

In other embodiments, this structure may be obtained by coating the wafer with spin-on material after a stressed nitride film is deposited. The stressed nitride film at the lower region on either side of the gate is protected by the spin-on material during subsequent material removal steps. In still another embodiment of the method, the enhanced stress structure may be achieved by using a CMP (chemical mechanical planarization) process to remove a nitride stack from the gate top region after a spin-on material has been applied. The latter technique may also be applicable to replacement gate processes.

Figure 1:
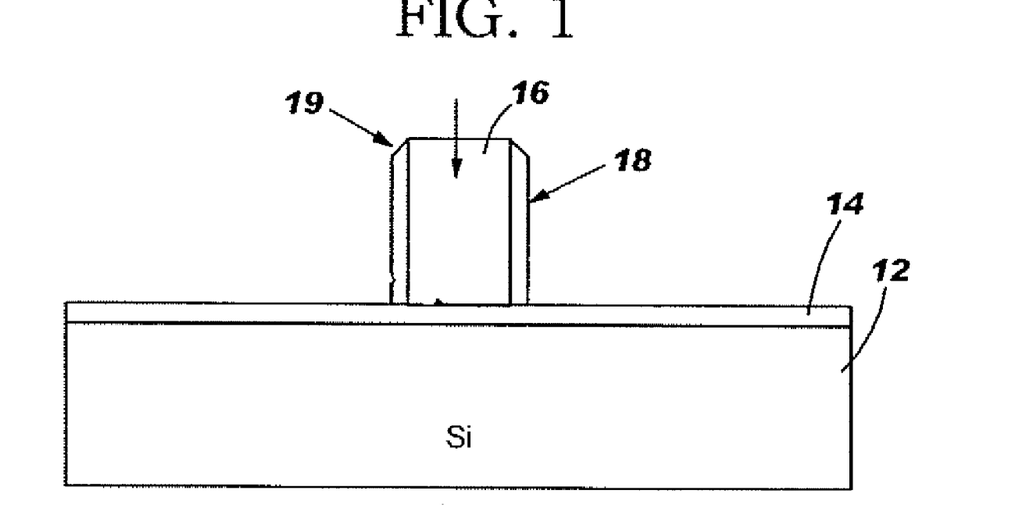
FIG. 1 illustrates a step in forming an embodiment in accordance with the invention.

Referring now to the figures, FIG. 1 shows a silicon substrate 12 having a gate oxide 14 formed on its upper surface. Next, a polysilicon gate 16 is formed on the gate oxide 14. Offset spacers or gate sidewalls 18 are formed on the side of the polysilicon gate 16. The offset spacers 18 are used to form a proper ion implanted extension structure within the silicon substrate 12.

Figure 2:
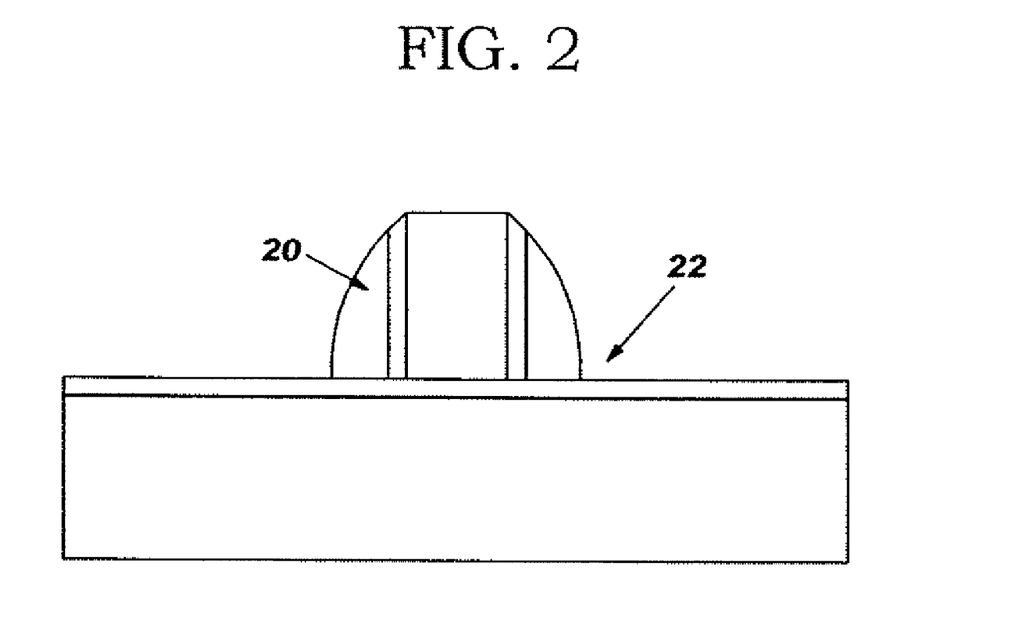
FIG. 2 illustrates a step in forming an embodiment in accordance with the invention.

FIG. 2 shows $Si_3N_4$ spacers 20 formed on each side of the polysilicon gate 16. The $Si_3N_4$ spacers 20 are attached to the offset spacers 18 prior to ion implantation. Next, ion implantation is used to form source/drain regions 22 within the silicon substrate 12 at either side of the polysilicon gate 16. For n-type transistors, a shallow and high-dose of arsenic ions, for example, may be used to form the source/drain regions. For the p-type transistors, a shallow and high dose of $BF_2$ ions, for example, may be used to form the source/drain regions.

Figure 3:
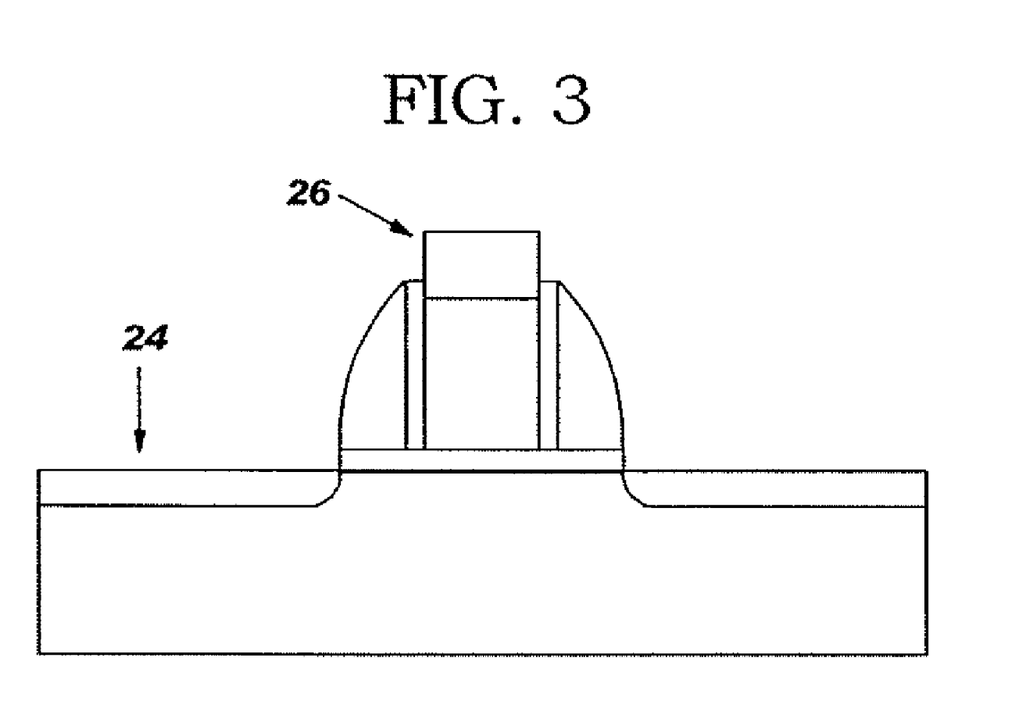
FIG. 3 illustrates a step in forming an embodiment in accordance with the invention.

FIG. 3 shows the gate oxide 14 removed on either side of the $Si_3N_4$ spacers 20. Also shown are substrate salicide regions 24 formed proximate to the source/drain regions 22 and a gate salicide region 26 formed on the polysilicon gate 16. The substrate and gate salicide regions, 24 and 26, may include CoSi or NiSi. The substrate and gate salicide regions, 24 and 26, are formed self-aligned to the source/drain regions 22 and polysilicon gate regions 16.

Figure 4:
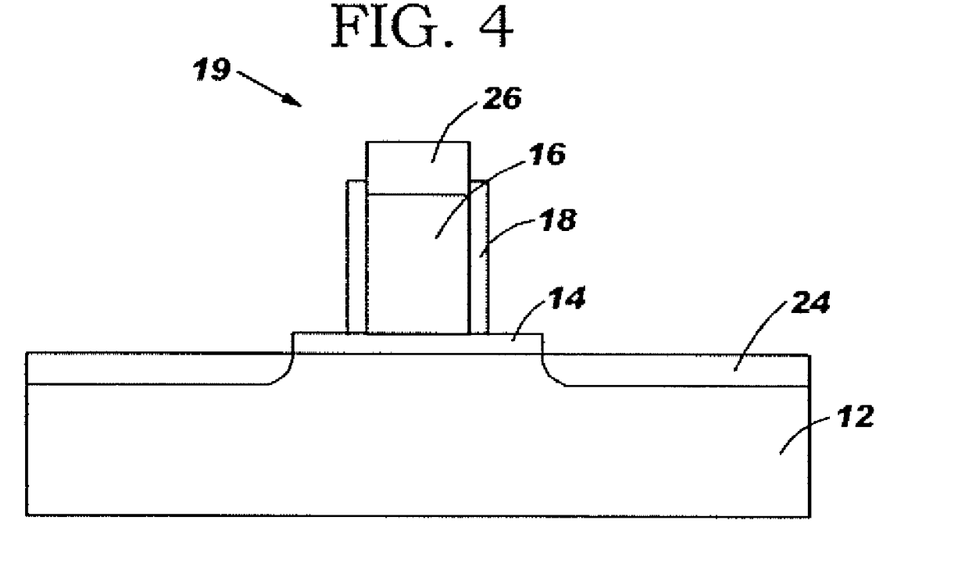
FIG. 4 illustrates a step in forming an embodiment in accordance with the invention.

FIG. 4 shows a semiconductor device before forming a stressed transistor channel having a silicon substrate 12 with a doped salicide region 24. On top of the silicon substrate 12 is a gate oxide 14, and on top of the gate oxide 14 is a polysilicon gate 16. Gate sidewalls 18 are formed on the sides of the polysilicon gate 16. A gate salicide region 26 is formed on the polysilicon gate 16 to complete the gate stack. Together, the polysilicon gate 16 and gate sidewalls 18 form the gate stack. For purposes of this description, the gate stack may also include, for example, the polysilicon gate 16, gate sidewalls 18, and gate salicide region 26. The structure thus described is formed in any conventional manner known to those of skill in the art.

As shown in FIG. 4, any $Si_3N_4$ spacer which may exist (referenced as numeral 20 in FIG. 2) is removed from gate sidewalls 18 using isotropic $Si_3N_4$ RIE (reactive ion etching) process, which is selective to CoSi and oxide. The $Si_3N_4$ spacer may be removed completely, reduced in size, or simply recessed using the RIE method. It should be noted that any process which removes or reduces the $Si_3N_4$ spacer from the top of the gate stack may be used, as should be known to those of skill in the art.

Figure 5:
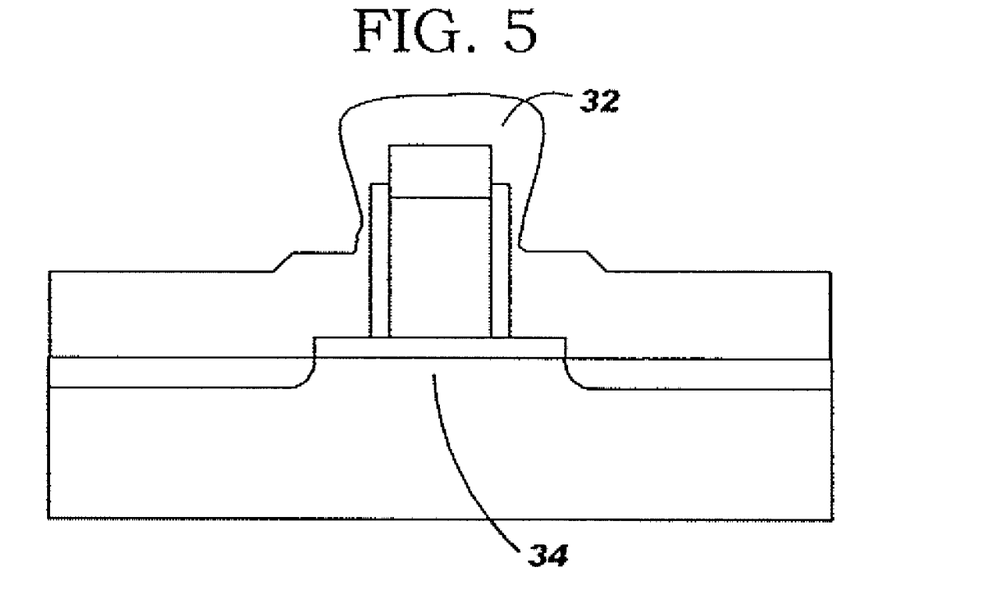
FIG. 5 illustrates a step in forming an embodiment in accordance with the invention.

Referring to FIG. 5, a non-conformal $Si_3N_4$ or nitride film 32 is deposited on the transistor gate using PECVD (plasma enhanced chemical vapor deposition) process. A non-conformal $Si_3N_4$ film can be formed using a PECVD deposition method at relatively low temperature, which is desirable at this stage of wafer processing. Although PECVD is used as an example, it should be noted that any process capable of depositing a non-conformal nitride film may be used. In one implementation, the nitride film 32 should be deposited so that there is little or no $Si_3N_4$ on gate sidewalls 18. Because the nitride film 32 is absent or reduced on the gate sidewalls 18, stress concentrators or raisers are created due to the abrupt termination of the material, causing a higher stress to be induced in the transistor channel 34, as further described below.

Figure 6:
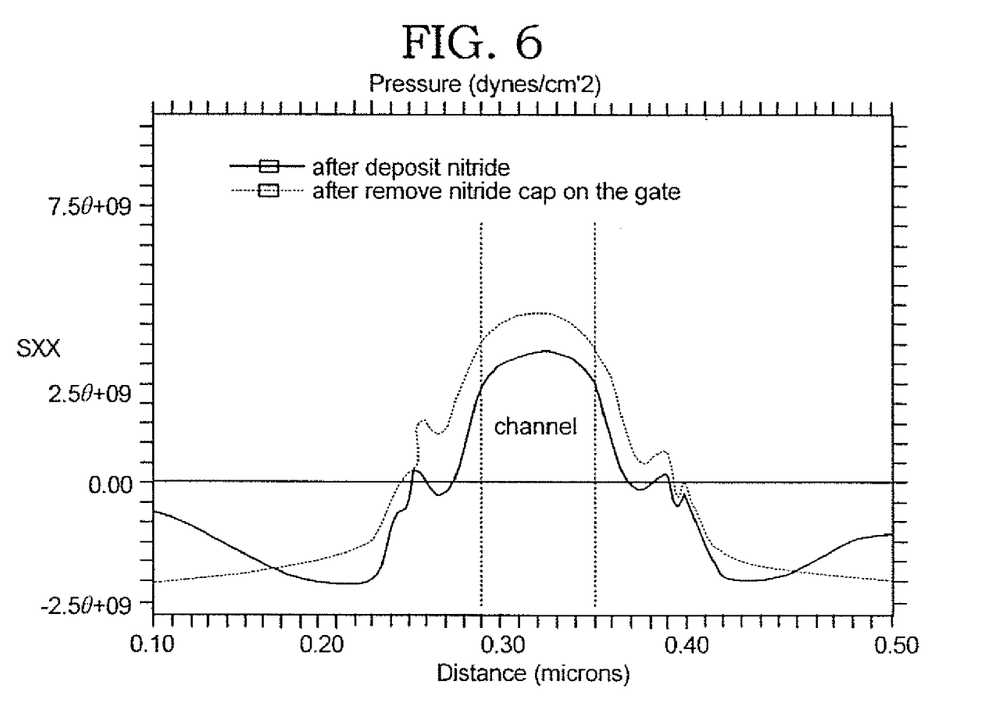
FIG. 6 illustrates a step in forming an embodiment in accordance with the invention.

FIG. 6 is a graph of the results of a numerical simulation of the stress, Sxx, in a transistor channel as a function of horizontal distance in microns along a device substrate for both before (solid line) and after (dashed line) removing a nitride cap in a region 5 nm below the gate oxide for a polysilicon gate 60 nm wide, where the nitride film has a stress, Sxx, of 2.0 GPa formed in the transistor channel which is greater than approximately $4.5 \times 10^9$ dynes/cm$^2$ at about 5 nm below a gate oxide, and a 50 nm thick spacer, which may be one implementing feature of the invention. In another implementation, the enhanced stress in the transistor channel is greater than approximately $5.5 \times 10^9$ dynes/cm$^2$ at about 5 nm below a gate oxide.

As shown by the graph of FIG. 6, the numerical simulation shows that stress in the corresponding transistor channel increases 39% when the $Si_3N_4$ Stack is removed from the top region of the gate, especially when the $Si_3N_4$ is removed from gate sidewalls near the top of the gate stack.

Figure 7:
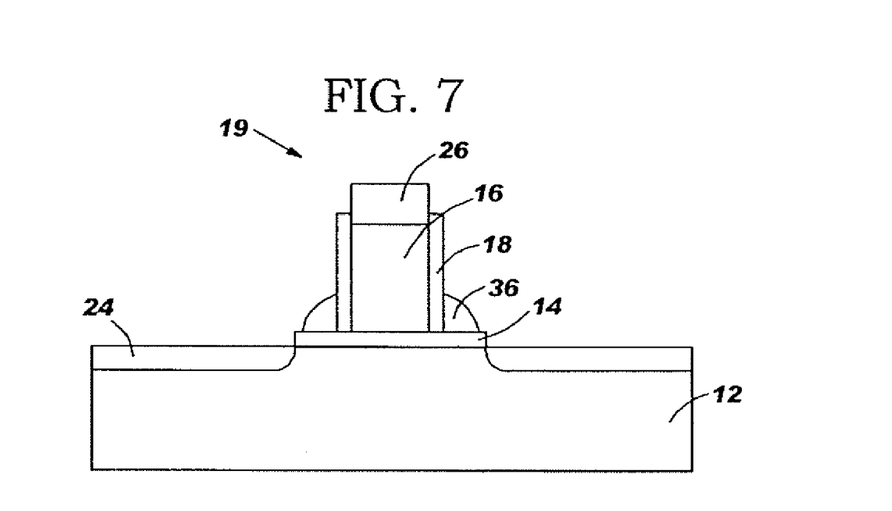
FIG. 7 illustrates a table showing stress vs. distance in a semiconductor device formed in accordance with the invention.
Figure 8:
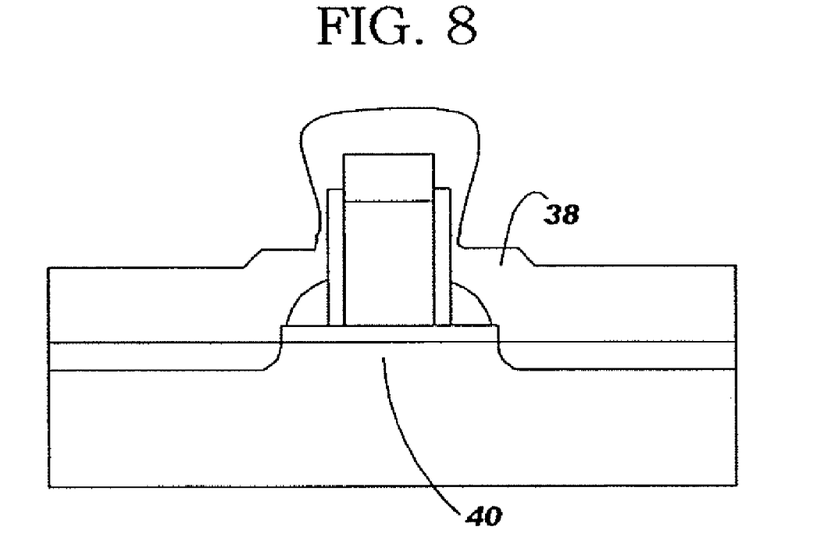
FIG. 8 illustrates a step in forming an embodiment in accordance with the invention.

Referring to FIGS. 7-8, another embodiment of transistor channel stress enhancement is shown where FIG. 7 illustrates a semiconductor device having a silicon substrate 12 with a gate oxide 14 thereon. The silicon substrate 12 has salicide region 24. A polysilicon gate 16 with gate sidewalls 18 is located on the gate oxide 14. A gate salicide region 26 is formed on top of the polysilicon gate 16.

In a variation to the device of FIG. 4, a $Si_3N_4$ spacer 36 is added to the device shown in FIG. 7. The spacer 36 of FIG. 7 occupies a small region on the surface of the silicon substrate 12 and gate sidewalls 18, as well as being formed on the lower region of the gate stack. That is, the spacer is not provided along the entire sidewall. Such a configuration minimizes the amount of $Si_3N_4$ formed near the top of the gate stack. The $Si_3N_4$ spacer 36 may be formed by various processes, such as, for example, recessing the $Si_3N_4$ 4 spacer 36 using RIE process, which is selective to $SiO_2$ and silicide. Any other process which may form a $Si_3N_4$ spacer towards the bottom of the gate stack may be used, as can be implemented by those of skill in the art.

Referring to FIG. 8, a non-conformal $Si_3N_4$ or nitride layer 38 is deposited on the device using, for example, a PECVD process so that there is little or no $Si_3N_4$ deposited on the gate sidewalls 18. Once again, by depositing a minimum amount of nitride on the gate sidewalls 18, the nitride structure terminates more abruptly creating stress concentrators or raisers, which enhance the stress formed in a transistor channel 40.

Although a PECVD process is used in the example, any process, such as, for example, high density plasma deposition, which may deposit a non-conformal nitride film may be used. Furthermore, any process which preferentially reduces the amount of nitride deposited on the gate sidewalls 18 may be used.

Figure 9:
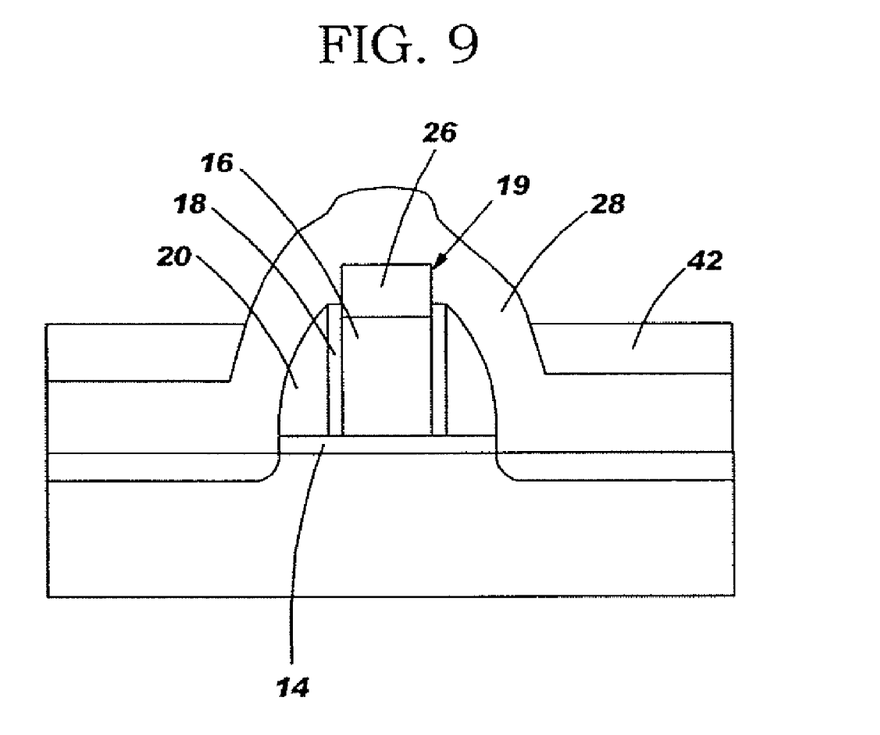
FIG. 9 illustrates a step in forming an embodiment in accordance with the invention.

Referring to FIG. 9, another method of enhancing stress in a transistor channel is shown where a nitride film 28 deposited over a silicon substrate 12 having a gate oxide 14, $Si_3N_4$ spacers 20, sidewall spacers 18 and polysilicon gate 16 with a gate salicide region 26 on top. After the nitride film 28 has been deposited, a spin-on material 42, such as, for example, ARC (antireflection coating), oxide, or SILK™ (a combination of silicon and low k dielectric material) is applied.

By applying a material using a spin-on technique, the material is preferentially deposited in the low spots and leaves the high spots uncoated. Additionally, any material which may act as a resist when the nitride film 28 is subsequently removed may be a suitable spin-on material. Thus, the spin-on coating method leaves the high points of the nitride film 28 exposed for further processing. Other methods which preferentially deposit material in the low regions and leave the high region exposed may used to form film on top of the nitride film 28.

Figure 10:
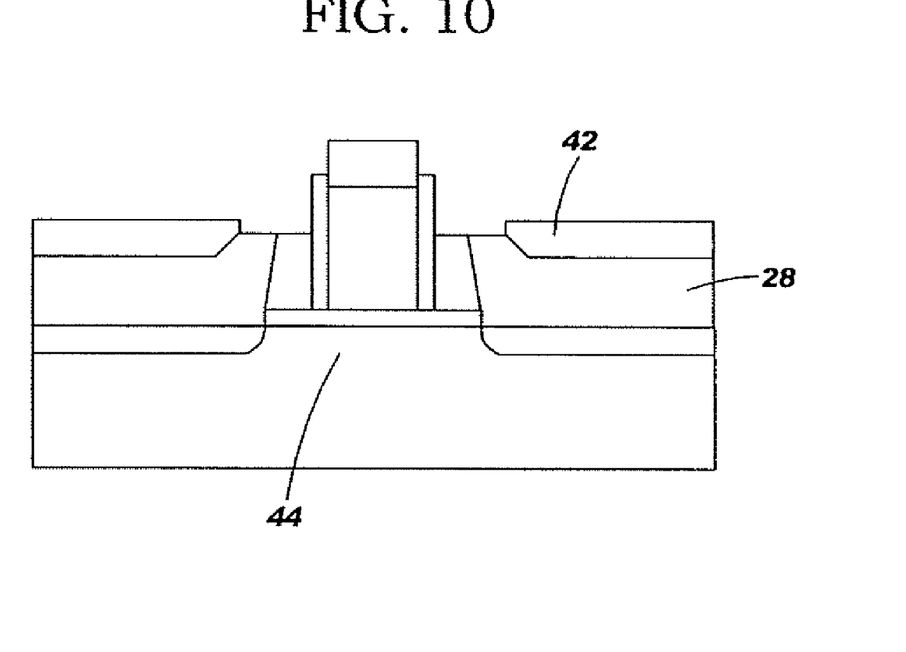
FIG. 10 illustrates a step in forming an embodiment in accordance with the invention.

Referring to FIG. 10, the exposed portion of the nitride film 28 is removed through a $Si_3N_4$ RIE process so that the nitride film 28 is preferentially removed only from the top of the gate stack. By removing the exposed portions of the nitride film 28, the upper portion of the gate stack is released from the nitride film 28 while the top of the silicon substrate remains covered. Such selective removal of the nitride film 28 forms a transistor channel 44 having enhanced stress therein due to the silicon substrate 12 remaining covered. The nitride film 28 may be removed by any process which preferentially removes the nitride film 28 and leaves the spin-on material 42.

Figure 11:
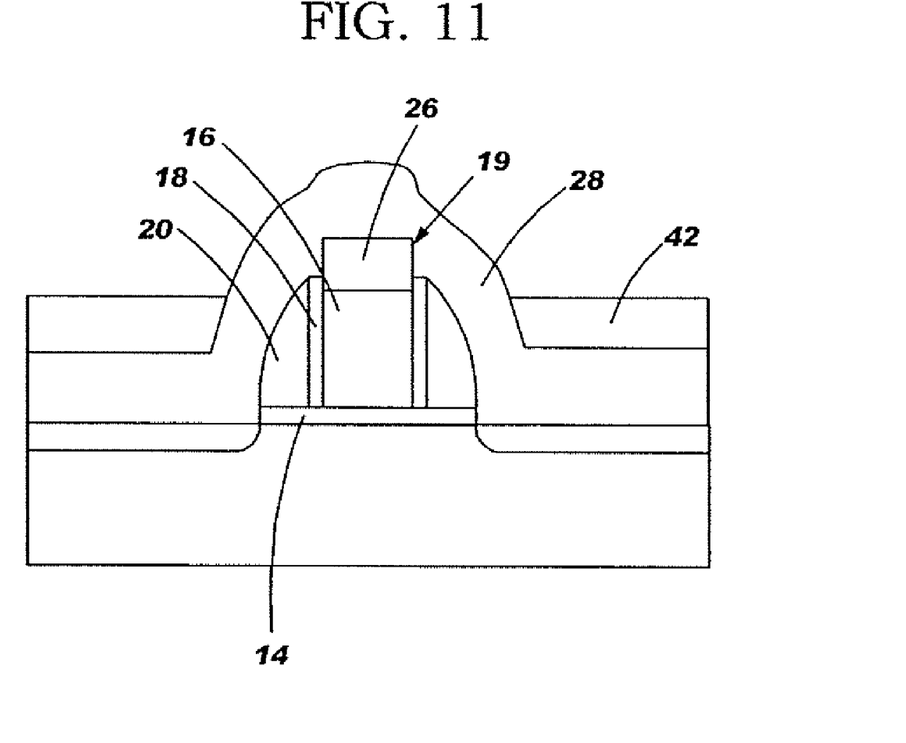
FIG. 11 illustrates a step in forming an embodiment in accordance with the invention.
Figure 12:
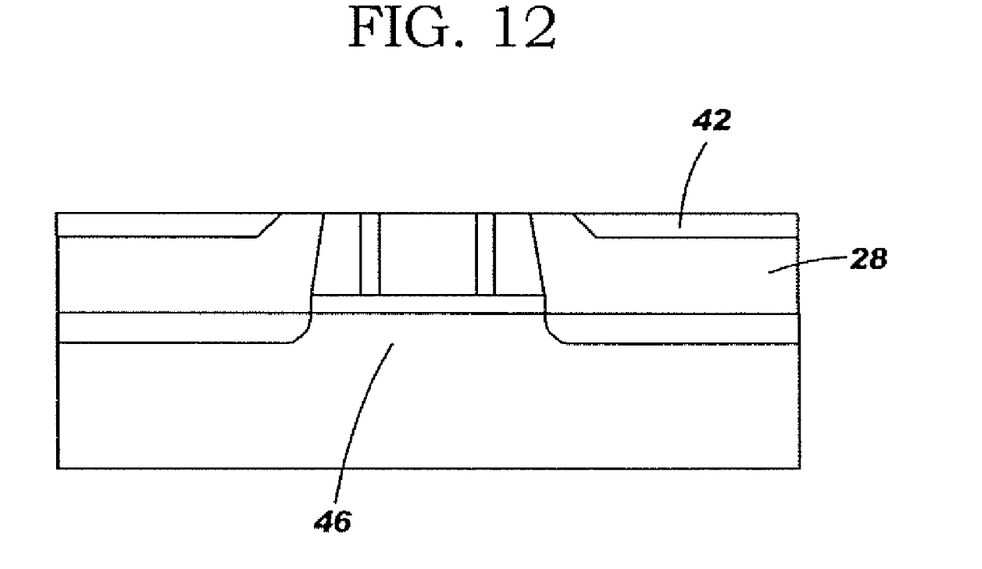
FIG. 12 illustrates a step in forming an embodiment in accordance with the invention.
Figure 13:
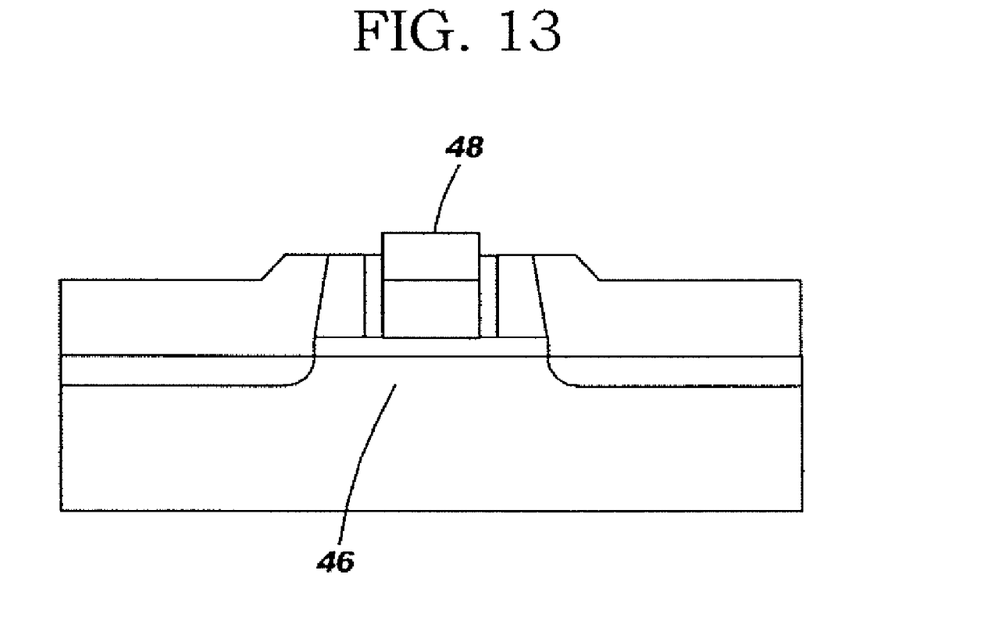
FIG. 13 illustrates a step in forming an embodiment in accordance with the invention.

FIGS. 11-13 illustrate another embodiment by which a transistor channel having enhanced stress may be formed. Referring to FIG. 11, a semiconductor device like that shown in FIG. 9 is illustrated having a silicon substrate 12 with a gate oxide 14 thereon. The silicon substrate 12 has salicide regions 24. A polysilicon gate 16 with gate sidewalls 18 is located on the gate oxide 14. A gate salicide region 26 is formed on top of the polysilicon gate 16, all of which is known by those of skill in the art and implemented in accordance with known practices. Additionally, a nitride coating 28 with exposed high spots and spin-on material 42 is shown. Alternatively, an oxide layer (HDP (high density plasma) oxide or BPSG (borophosphorosilicate glass)) may be applied leaving the high spots of the nitride film 28 exposed. Additionally, any material which may act as a resist when the nitride film 28 is subsequently removed may be a suitable spin-on material.

As shown in FIG. 12, the wafer is planarized using CMP to remove the exposed portion of the nitride film 28 and the top region of the gate stack. Accordingly, the silicon substrate 12 remains covered with nitride film 28 while the top of the gate stack is removed. By removing the top of the gate stack along with any nitride film 28 formed thereon, an enhanced stress transistor channel 46 is formed within the silicon substrate 12. Any other known method to planarize the wafer may be used to remove the top of the gate stack.

Finally, as shown in FIG. 13, the spin-on material 42 is removed, and a salicide gate region 48 is formed on the top of the gate stack. Any method which preferentially removes the spin-on material may used for this step. Once again, the resulting structure includes a substrate covered with a nitride film, while avoiding nitride film on an upper portion of a gate stack. It should be noted that the method illustrated in FIGS. 11-13 may be readily applicable to a replacement gate process.

While the invention has been described in terms of embodiments, those skilled in the art will recognize that the invention can be practiced with modification within the spirit and scope of the appended claims. For example, the invention can be readily applicable to bulk substrates.

It is claimed:

1. A semiconductor device, comprising:
   a silicon substrate;
   a gate stack disposed on the silicon substrate; and
   a stressed nitride film on the silicon substrate and the gate stack, wherein the stressed nitride film comprises a thicker portion deposited on the silicon substrate and a thinner portion deposited on a portion of the gate stack.

2. The semiconductor device of claim 1, further comprising spacers disposed on the substrate between the stressed nitride film and the gate stack leaving an upper portion of the gate stack exposed.

3. The semiconductor device of claim 1, further comprising a salicide gate region formed on a top of the gate stack.

4. The semiconductor device of claim 1, wherein the nitride film is thicker over a surface of the substrate and thinner over the portion of the gate stack.

5. The semiconductor device of claim 1, wherein a gate is about 60 nm wide and a spacer is about 50 nm wide 6. The semiconductor device of claim 5, wherein the stressed nitride film provides a stress of about 2.0 GPa.

7. The semiconductor device of claim 6, wherein an enhanced stress in a transistor channel is greater than approximately $4.5 \times 10^9$ dynes/$cm^2$ at about 5 nm below a gate oxide.

8. A semiconductor device, comprising:
   a silicon substrate;
   a gate stack disposed on the silicon substrate;
   a stressed nitride film on the silicon substrate and the gate stack, wherein the stressed nitride film is thicker over the silicon substrate and thinner over a portion of the gate stack, wherein the stressed nitride film is substantially absent in the upper portion of the gate stack.

9. The semiconductor device of claim 8, further comprising only a lower portion of the gate stack.

10. The semiconductor device of claim 9, further comprising a spin-on material disposed over the stressed nitride film leaving the gate stack exposed.

11. A semiconductor device, comprising:
    a silicon substrate;
    a gate stack disposed on the silicon substrate;
    a stressed nitride film on the silicon substrate and the gate stack, wherein the stressed nitride film is thicker over the silicon substrate and thinner over a portion of the gate stack, wherein a spacer is adjacent only a lower portion of the gate stack.

12. The semiconductor device of claim 11, wherein the spacer comprises reducing a size of the spacer.

13. A semiconductor device, comprising:
    a silicon substrate;
    a gate stack disposed on the silicon substrate;
    a stressed nitride film on the silicon substrate and the gate stack, wherein the stressed nitride film is thicker over the silicon substrate and thinner over a portion of the gate stack, wherein the stressed nitride film is a non-conformal nitride film.

14. A semiconductor device, comprising
    a silicon substrate with a gate oxide thereon;
    a gate stack with gate sidewalls is located on the gate oxide;
    a gate salicide region formed on top of the gate stack;
    a nitride film on a surface of the silicon substrate;
    a stressed transistor channel formed within the silicon substrate; and a salicide gate region formed on the top of the gate stack.

15. A semiconductor device, comprising:
a silicon substrate with a gate oxide thereon;
a gate stack with gate sidewalls is located on the gate oxide;
a gate salicide region formed on top of the gate stack;
a nitride film on a surface of the silicon substrate;
a stressed transistor channel formed within the silicon substrate; and
a salicide gate region formed on the top of the gate stack, wherein an upper portion of the gate stack is substantially devoid of the nitride film.

* * * * *